United States Patent
Tamura

[11] Patent Number: 5,948,165
[45] Date of Patent: Sep. 7, 1999

[54] ELECTROSTATIC CHUCKING MECHANISM

[75] Inventor: Takahiro Tamura, Tokyo, Japan

[73] Assignee: Anelva Corporation, Tokyo, Japan

[21] Appl. No.: 08/695,023

[22] Filed: Aug. 9, 1996

[30] Foreign Application Priority Data

Aug. 11, 1995 [JP] Japan .................................. 7-227323

[51] Int. Cl.⁶ .................................................. C23C 16/00
[52] U.S. Cl. ............................ 118/715; 118/500; 156/345
[58] Field of Search ............................ 156/345; 118/500, 118/715; 361/234; 279/128

[56] References Cited

U.S. PATENT DOCUMENTS

| | | | |
|---|---|---|---|
| 5,078,851 | 1/1992 | Nishihata | 204/298.34 |
| 5,486,974 | 1/1996 | Kasahara | 361/234 |
| 5,691,876 | 11/1997 | Chen | 361/234 |

Primary Examiner—Bruce Breneman
Assistant Examiner—Erin Fieler
Attorney, Agent, or Firm—Sughrue, Mion, Zinn, Macpeak & Seas, PLLC

[57] ABSTRACT

An electrostatic chucking mechanism including an electrode body, a dielectric block placed on the front of the electrode body and having a dielectric portion to be dielectrically polarized for electrostatically chucking an object to be chucked, and an intermediate layer placed between the electrode body and the dielectric block. The intermediate layer is formed of a metal such as indium having extendibility for absorbing thermal deformation of the electrode body or the dielectric block and is heated and pressurized, thereby joining the electrode body and the dielectric block. A thin film of indium, chrome, or the like, is prepared on the junction face of the dielectric block, enhancing a junction force and adhesion by the intermediate layer.

10 Claims, 3 Drawing Sheets

ELECTROSTATIC CHUCKING MECHANISM

BACKGROUND OF THE INVENTION

1. Field of the Invention

This invention relates to a mechanism for electrostatically chucking an object and, more particularly, to a mechanism for holding a substrate in a system for processing the substrate under a vacuum atmosphere.

2. Description of the Related Art

A technique for electrostatically holding an object is frequently used with vacuum processing systems for processing substrates under a vacuum atmosphere.

FIG. 4 is a sectional schematic front view to show a configuration example of an electrostatic chucking mechanism adopted for a plasma enhanced chemical vapor deposition (PECVD) system as an example of a conventional electrostatic chucking mechanism together with the configuration of the system.

The electrostatic chucking mechanism shown in FIG. 4 comprises an electrode body 1 and a dielectric block 2 being placed on the front of the electrode body 1 and containing a dielectric portion 21 dielectrically polarized by a DC voltage applied via the electrode body 1 for electrostatically chucking an object to be chucked.

First, the electrode body 1 is a member shaped like a low circular cylinder or prism and formed of a metal such as aluminum.

The dielectric block 2 is a member shaped like a disk or flat thin square piece projecting on the substrate chucking side for chucking a substrate 3 on the surface of the projecting portion. The dielectric block 2 is formed of ceramics or the like, consisting essentially of aluminum oxide. In the following description, the side chucking the substrate 3 will be referred to as the "front" and the opposite side thereto as the "rear".

The electrode body 1 is fixed on its front to the rear of the dielectric block 2 by using screws. That is, the electrode body 1 is formed with through-holes that fixing screws 4 threadably engage, and the fixing screws 4 pass through the through-holes and project forwardly. Small recesses are made in positions corresponding to the projecting positions of the fixing screws 4 on the rear of the dielectric block 2 and metal tap bodies 5 are disposed so as to be inserted into the small recesses.

The tap bodies 5 are provided because the dielectric block 2 is hard to be directly threaded; the inner face of the cylindrical member of each tap body is threaded. The fixing screws 4 are screwed in the tap bodies 5, whereby the dielectric block 2 is fixed to the electrode body 1.

A bias high-frequency power supply 6 for applying a bias voltage to the substrate 3 by the interaction with plasma is connected to the electrode body 1 via a blocking capacitor 61. A DC power supply 7 for electrostatic chucking is also connected to the electrode body 1 via a filter 71 for removing high frequency components. Further, a flow path 11 for allowing a heating medium (gas or liquid) for temperature adjustment to flow is formed in the electrode body 1, and pipes 12 and 13 are provided for supplying and collecting the heating medium to and from the flow path.

On the other hand, an auxiliary electrode plate 22 is embedded in the dielectric block 2 in a parallel position with the front face of the dielectric block 2. The auxiliary electrode plate 22 and the electrode body 1 are electrically connected to each other by a connection block 23 made of a conductor. A DC voltage applied from the DC power supply 7 to the auxiliary electrode plate 22 causes the dielectric portion 21 on the top of the auxiliary electrode plate 22 to be dielectrically polarized, whereby the substrate 3 is electrostatically chucked.

The PECVD system adopting the above-described electrostatic chucking mechanism consists mainly of a reactor 100 in which the electrostatic chucking mechanism is placed, an exhaust channel 101 for exhausting air from the inside of the reactor 100, a plasma chamber 102 located communicating with the space in the reactor 100, a gas introduction mechanism 103 for introducing reaction gases into the reactor 100, and a power supply mechanism 104 for energizing the gases diffused in the plasma chamber 102 for generating plasma. In addition, a member 105 is provided for electrically insulating the electrode body 1 from the reactor 100, and teflon, quarts, alumina ceramics or the like is usually used for the member 105.

The PECVD system shown in FIG. 4 introduces, for example, mono-silane gas, oxygen gas, and argon gas by the gas introduction mechanism 103 and supplies a high-frequency power by the power supply mechanism 104. The mono-silane gas decomposes in the generated plasma and a silicon oxide thin film deposits on the substrate 3 chucked by the electrostatic chucking mechanism. At this time, the bias high-frequency power supply 6 operates and interacts with the plasma for applying a bias voltage to the substrate 3, whereby ions in the plasma come into collision with the substrate 3 and energy of the ion collision aids in growth of the thin film.

The electrostatic chucking mechanism as described above is often used in thermally harsh environments. For example, with the electrostatic chucking mechanism adopted for the PECVD system described above, the electrode body is maintained at about 100° C. by a heating medium allowed to flow in the electrode body during the PECVD processing. Further, ion collision caused by a bias voltage causes a substrate to be heated to about 400°C., for example, and therefore the temperature of the electrostatic chucking mechanism also is heated to such a temperature.

On the other hand, since plasma does not exist in the break period between completion of PECVD processing of one substrate and processing of another substrate, any bias voltage is not applied either and therefore the temperature of the electrostatic chucking mechanism is restored to about 100° C. When another substrate is transferred in the reactor and PECVD processing is started, again the electrostatic chucking mechanism is heated to about 400° C. This means that the temperature of the electrostatic chucking mechanism rises and falls repeatedly between 100° C. and 400° C.

If the electrostatic chucking mechanism is thus used under a thermally harsh condition that the temperature of the electrostatic chucking mechanism vigorously rises and falls repeatedly in a high-temperature region, the following problem arises: From the thermal expansion coefficient difference between the dielectric block 2 made of ceramics or the like, and the metal members of the electrode body 1, the tap bodies 5, the fixing screws 4 or the like, thermal stress distortion concentrates on the peripheries of the fixing screws 4 and the dielectric block 2 may sometimes be cracked in the peripheries of the fixing screws 4.

To avoid this problem, it is possible to use an adhesive for bonding the dielectric block 2 to the electrode body 1. However, in doing so, as the temperature rises, the organic components of the adhesive evaporate and adhere to the substrate, causing the substrate to be contaminated. A problem that the adhesive degrades due to evaporation of the organic components and that the bonded part will come off may also arise.

SUMMARY OF THE INVENTION

It is an object of the invention to provide an electrostatic chucking mechanism drastically improved in durability for use under environments involving severe temperature rise and fall, which was hard to accomplish with the conventional electrostatic chucking mechanism.

In attaining the above object, the invention provides an electrostatic chucking mechanism comprising: an electrode body; a dielectric block being placed on a front of the electrode body and containing a dielectric portion to be dielectrically polarized by a DC voltage applied via the electrode body for electrostatically chucking an object to be chucked; and an intermediate layer placed between the electrode body and the dielectric block, the intermediate layer being formed of a metal having extendibility for absorbing thermal deformation of the electrode body or the dielectric block, and being heated and pressurized, thereby joining the electrode body and the dielectric block.

DETAILED DESCRIPTION OF THE PREFERRED EMBODIMENTS

Referring now to the accompanying drawings, there are shown preferred embodiments of the invention.

Figure 1:
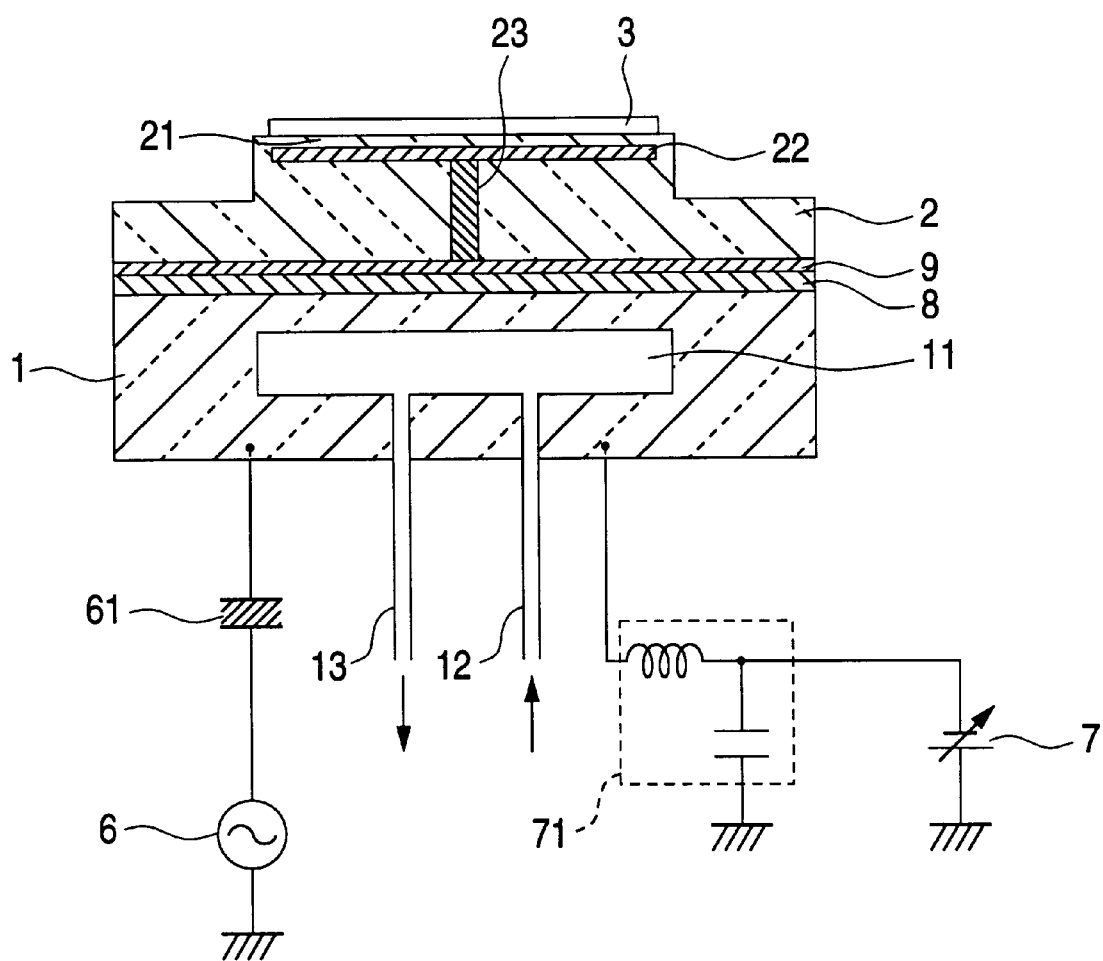
FIG. 1 is a sectional schematic front view to explain an embodiment of an electrostatic chucking mechanism of the invention.

FIG. 1 is a sectional schematic front view to explain an embodiment of an electrostatic chucking mechanism of the invention. Like the conventional one shown in FIG. 4, the electrostatic chucking mechanism shown in FIG. 1 comprises an electrode body 1 and a dielectric block 2 being placed on the front of the electrode body 1 and containing a dielectric portion 21 dielectrically polarized by a DC voltage applied via the electrode body 1 for electrostatically chucking an object to be chucked.

Like the conventional one, the electrode body 1 is a member shaped like a low circular cylinder or prism and formed of a metal such as aluminum.

Also like the conventional one, the dielectric block 2 is a convex member being shaped like a disk or flat thin square formed of ceramics or the like, consisting essentially of aluminum oxide for chucking a substrate 3 on the surface of the convex portion.

The electrostatic chucking mechanism of the embodiment differs from the conventional one largely in that the electrode body 1 and the dielectric block 2 are joined by a different material junction with an intermediate layer 8 placed between the electrode body 1 and the dielectric block 2 rather than by fixing screws as in the conventional electrostatic chucking mechanism.

First, the intermediate layer 8 is formed of indium and is about 0.3–1 mm thick. In the embodiment, the front face of the electrode body 1 and the rear face of the dielectric block 2 forming the junction faces have almost the same dimensions and shape; the intermediate layer 8 is disposed extending over almost the full junction faces. However, the front face of the electrode body 1 and the rear face of the dielectric block 2 may be formed with openings and recesses for disposing pins and pipes in addition to those shown in the figure. In this case, the intermediate layer 8 may not be disposed in such openings or recesses. The end of the intermediate layer 8 reaches the inner position about 1 mm from the end of the junction faces.

The different material junction with the intermediate layer 8 made of indium is accomplished by the following method:

First, a thin film 9 of indium is prepared about 0.5–1 $\mu$m on the rear face of the dielectric block 2 by a method such as sputtering or vacuum evaporation. If the indium thin film 9 is thus prepared, microscopic asperities on the rear face of the dielectric block 2 or surface roughness can be coated to make a flat surface.

Next, while the electrode body 1 is heated to about 150° C., an amount of indium is piled at the center of the front of the electrode body 1. The piled indium is melted by using an ultrasonic soldering iron or the like. At this time, impurities of oxide of indium and slag stand out on the surface of molten indium, and are removed carefully. If the impurities are not removed, the different material junction effect with the intermediate layer 8 lowers.

The rear face of the dielectric block 2 formed with the indium thin film is overlaid on the front face of the electrode body 1 on which molten indium is thus piled. In this state, both are heated to about 180° C. and the junction surfaces are pressurized for about 10 minutes at a pressure of about 20 grams/cm$^2$. In doing so, they can be joined without causing bubbles to occur in the junction parts by the intermediate layer 8. When the electrostatic chucking mechanism joined under the above condition was shot by X-rays, the bubble generation percentage was 1% or less of the entire area of the junction faces.

After completion of pressurization as described above, the electrostatic chucking mechanism is cooled gradually for more than two hours. If it is cooled rapidly, a problem such that bubbles occur on the junction faces still arises. If bubbles occur, thermal conduction efficiency of the junction parts by the intermediate layer 8 is lowered, and when high-frequency power is applied to the electrostatic chucking mechanism, abnormal discharge may occur in the bubble parts.

By performing such joining, the dielectric block 2 is joined to the electrode body 1 via the intermediate layer 8 made of indium. As seen from the above description, "joining" does not mean simply bringing both surfaces into contact and is used to mean fixing, namely, a state in which both surfaces do not come off unless a force more than reasonable is applied.

The reason why the dielectric substance and metal can be joined by heating and pressurizing the intermediate layer 8 made of indium is not completely clarified at this point of time; from the fact that the junction force lowers if impurities are not removed when indium is molten, it is also possible to consider that eutectic bonding or the like occurs between the thin film 9 prepared on the rear face of the dielectric block 2 and the intermediate layer 8, causing a junction force to occur.

Indium is a soft metal and has extendibility. Therefore, if the electrostatic chucking mechanism is structured as described above, the intermediate layer 8 made of indium placed between the dielectric block 2 and the electrode body 1 acts so as to absorb thermal expansion distortion caused by the thermal expansion coefficient difference between the dielectric block 2 and the electrode body 1. That is, the intermediate layer 8 absorbs thermal deformation (thermal expansion, thermal shrinkage) of both the dielectric block 2 and the electrode body 1 and eases thermal stress distortion. Thus, cracking of the dielectric block 2 caused formerly by adopting fixing screws does not occur.

The term "extendibility" means that a substance is deformed more than reasonable when a load is put, for example, like Brinell hardness. In this case, the substance may be elastic or plastic.

The intermediate layer 8 made of indium also has a function of improving thermal conductivity between the electrode body 1 and the dielectric block 2. That is, if a structure wherein the intermediate layer 8 does not exist and the electrode body 1 and the dielectric block 2 come in direct face contact with each other for thermal conduction is adopted, the presence of microscopic asperities or surface roughness is inevitable on the front face of the electrode body 1 or the rear face of the dielectric block 2. Thus, thermal conduction concentrates on contact parts of such asperities or the like, making uneven thermal conduction or worsening thermal conductivity. However, a material having good thermal conductivity and extendibility is placed between the electrode body 1 and the dielectric block 2 as the intermediate layer 8 in the embodiment, whereby thermal contact between the electrode body 1 and the dielectric block 2 is improved, so that temperature control allowing a heating medium to flow through the electrode body 1 can be performed with good responsibility.

Further, the intermediate layer 8 made of indium in the embodiment also plays a role in bringing the electrode body 1 and an auxiliary electrode plate 22 into conduction via a connection block 23.

The electrostatic chucking mechanism thus structured operates like the conventional one. That is, a voltage applied from a DC power supply 7 causes the dielectric portion 21 on the front of the auxiliary electrode plate 22 to be dielectrically polarized, whereby the substrate 3 is electrostatically chucked. At this time, a bias high-frequency power supply 6 operates as required and interacts with plasma for applying a bias voltage to the substrate 3.

Table 1 lists the test results of durability of the electrostatic chucking mechanism of the embodiment and the conventional one.

TABLE 1

| Electrostatic Chucking Mechanism No. | Number of Substrates Processed | Passed or Not Passed in Durability Test | Remarks |
| --- | --- | --- | --- |
| 1 | 1000 | passed | embodiment |
| 2 | 1000 | passed | embodiment |
| 3 | 1000 | passed | embodiment |
| 4 | 1000 | passed | embodiment |
| 5 | 1000 | passed | embodiment |
| 6 | 1000 | passed | embodiment |
| 7 | 1000 | passed | embodiment |

TABLE 1-continued

| Electrostatic Chucking Mechanism No. | Number of Substrates Processed | Passed or Not Passed in Durability Test | Remarks |
| --- | --- | --- | --- |
| 8 | 1000 | passed | embodiment |
| 9 | 1000 | passed | embodiment |
| 10 | 1000 | passed | embodiment |
| 11 | 236 | not passed | conventional |
| 12 | 502 | not passed | conventional |
| 13 | 78 | not passed | conventional |
| 14 | 3 | not passed | conventional |
| 15 | 135 | not passed | conventional |
| 16 | 56 | not passed | conventional |
| 17 | 331 | not passed | conventional |
| 18 | 97 | not passed | conventional |
| 19 | 177 | not passed | conventional |
| 20 | 224 | not passed | conventional |

Figure 4:
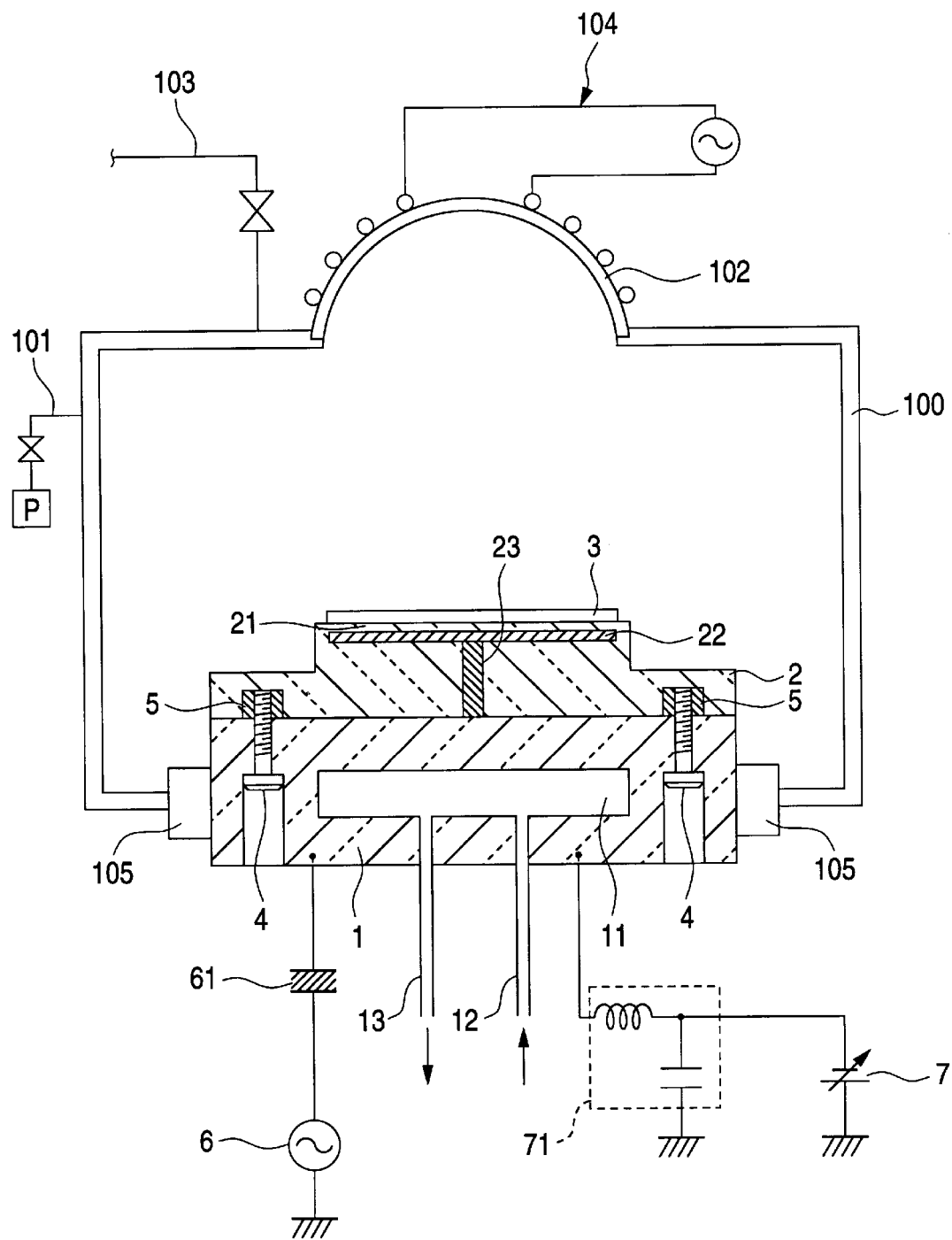
FIG. 4 is a sectional schematic front view to show a configuration example of an electrostatic chucking mechanism adopted for a plasma enhanced chemical vapor deposition system as an example of a conventional electrostatic chucking mechanism together with the configuration of the system.

In the durability test, the electrostatic chucking mechanisms shown in FIGS. 1 and 4 were installed in the PECVD system shown in FIG. 4 while they were replaced, and semiconductor substrates were chucked to them for getting PECVD processing one at a time. The number of semiconductor substrates processed for continuing the stable chucking operation was checked. A high-frequency power of 13.56 MHz and 2 kW was applied from the bias high-frequency power supply 6 for giving a bias voltage of about −1000 V to the substrate.

Normally, if the dielectric block 2 of the electrostatic chucking mechanism cracks and is damaged, a chucking force to the object to be chucked is lost or the chucking force distribution in the chucking face becomes uneven. In this case, the chucked object cracks or is placed out of a chucking position and cannot be collected by a robot or the like. Therefore, whether or not the electrostatic chucking mechanism performs the normal chucking operation was determined depending on whether or not semiconductor substrates can be collected after PECVD processing.

In the durability test, 10 electrostatic chucking mechanisms of the embodiment and 10 conventional ones were manufactured and tested. Table 1 lists the total number of substrates processed so far when substrate collection was impossible for each of the numbered electrostatic chucking mechanisms. The total number of processed substrates listed as 1000 means that the electrostatic chucking mechanism could perform the normal chucking operation over 1000 substrates, which was determined to be passed in the durability test. In Table 1, numbers 1–10 denote the electrostatic chucking mechanisms according to the embodiment and numbers 11–20 denote the conventional ones.

As listed in Table 1, when the conventional electrostatic chucking mechanisms were used, the chucking operation was unstable and none of the 10 electrostatic chucking mechanisms passed the durability test. The term in which the normal chucking operation can be performed also varied from one electrostatic chucking mechanism to another. For example, the electrostatic chucking mechanism No. 12 showed durability within the substrate processing term of about 500 substrates, but substrate collection became impossible for the electrostatic chucking mechanism No. 14 after processing of a scant three substrates. When substrate collection became impossible, the reactor of the PECVD system was opened to atmosphere and the electrostatic chucking mechanism was observed. A crack occurred from the part fixed by the fixing screw 4 and the dielectric block 2 cracked.

On the other hand, when the electrostatic chucking mechanisms of the embodiment were used, all of the electrostatic chucking mechanisms Nos. 1–10 carried out the normal chucking operation in the substrate processing term of 1000 substrates and passed the durability test. A condition such as a substrate crack or impossible substrate collection did not occur. When each electrostatic chucking mechanism was taken out from the reactor and was observed after processing of 1000 substrates, no crack appeared in the dielectric block 2.

Also as seen from the results in Table 1, the electrostatic chucking mechanism of the embodiment can drastically enhance durability for use under environments involving severe temperature rise and fall, which was hard to accomplish with the conventional electrostatic chucking mechanism.

Figure 2:
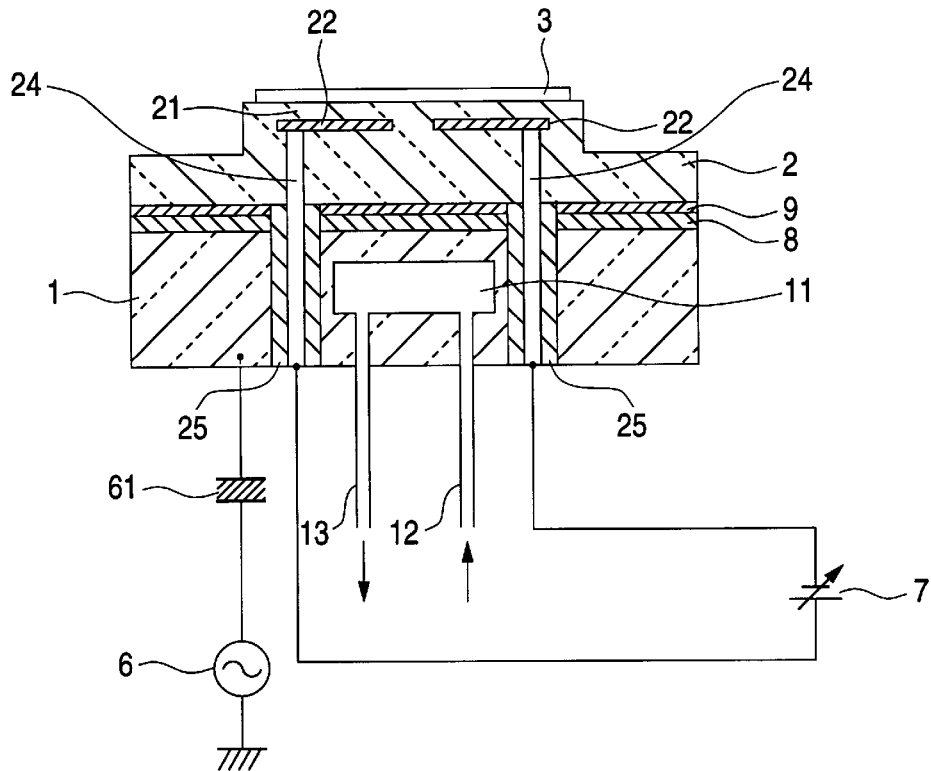
FIG. 2 is a sectional schematic front view to explain another embodiment of the electrostatic chucking mechanism of the invention.
Figure 3:
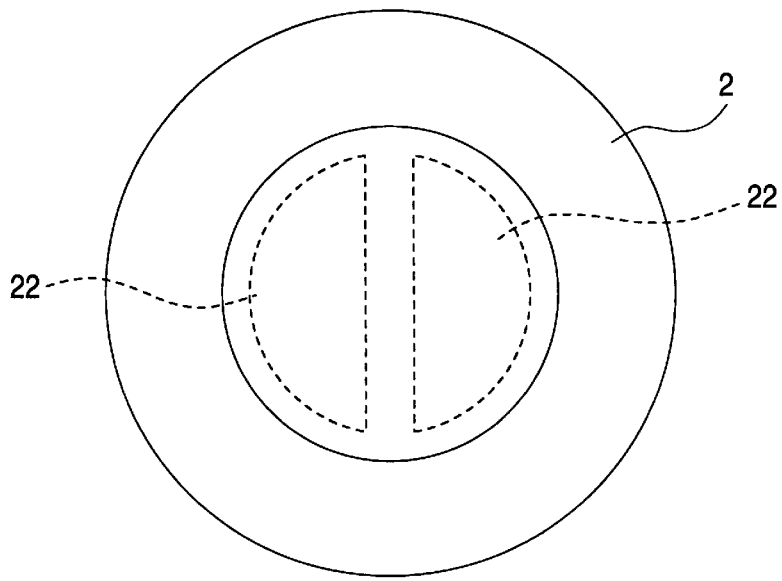
FIG. 3 is a schematic plan view to explain the structure of an auxiliary electrode plate adopted for the electrostatic chucking mechanism in FIG. 2.

FIG. 2 is a sectional schematic front view to explain another embodiment of the electrostatic chucking mechanism of the invention. FIG. 3 is a schematic plan view to explain the structure of an auxiliary electrode plate adopted for the electrostatic chucking mechanism in FIG. 2. Like the electrostatic chucking mechanism of the embodiment shown in FIG. 1, the electrostatic chucking mechanism shown in FIG. 2 comprises an electrode body 1 and a dielectric block 2 being placed on the front of the electrode body 1 and containing a dielectric portion 21 dielectrically polarized by a DC voltage applied via the electrode body 1 for electrostatically chucking an object to be chucked.

The electrostatic chucking mechanism of this embodiment differs largely from that shown in FIG. 1 in that the auxiliary electrode plate 22 in FIG. 1 is divided into two auxiliary electrode plates 22 and that a DC power supply 7 is connected so as to apply a DC voltage between the two auxiliary electrode plates 22. Such a structure also enables dielectric polarization of the dielectric portion 21 on the top of the auxiliary electrode plates 22 for chucking a substrate 3.

As shown in FIG. 3, a member shaped like a disk is divided into two parts as the two auxiliary electrode plates 22, which are slightly spaced from each other. As shown in FIG. 2, power supply bodies 24 for supplying a DC voltage to the two auxiliary electrode plates 22 are connected at their tips to the auxiliary electrode plates 22, pass through the dielectric block 2 and the electrode body 1, extend downward, and are connected to the DC power supply 7 outside the electrode body 1. Insulating blocks 25 are placed between the electrode body 1 and the power supply bodies 24 for insulating them so that a high-frequency electric field produced by a bias high-frequency power supply 6 is not superposed on a DC electric field between the two auxiliary electrode plates 22.

In addition to the embodiments, without using the auxiliary electrode plate 22 and the connection block 23 in the configuration in FIG. 1, a DC voltage superposed on the electrode body 1 can also cause the entire dielectric block 2 to be dielectrically polarized for chucking the substrate 3. Such a structure is appropriate for forming an electrostatic chucking mechanism excellent in durability with a thick dielectric portion to be dielectrically polarized for electrostatic chucking. The front of the dielectric block 2 may be etched on exposure to plasma, reaction gas and the like, in which case the dielectric portion can be thickened for providing a long-life electrostatic chucking mechanism.

In the above embodiments, metal such as tin as well as indium can be used as a material of the intermediate layer 8. An alloy consisting essentially of indium or tin, for example, a lead alloy may also be used. Further, an alloy of indium and tin may be used. If a material is molten and impurities are removed, a good junction force is provided. Thus, preferably the material of the intermediate layer 8 is a metal having a low melting point of 450° C. or less to facilitate melting work. In this case, preferably the electrostatic chucking mechanism is used at temperatures less than the melting point of the material of the intermediate layer 8. To use the electrostatic chucking mechanism at temperatures more than the melting point, a block plate for preventing the material of the intermediate layer 8 from melting out may be disposed at the end between the electrode body 1 and the dielectric block 2.

Further, the thin film 9 on the rear face of the dielectric block 2 may be made of chrome, in addition to indium. Particularly a thin film made of chrome comes in good intimate contact with ceramics and it is therefore hard for the thin film to come off, thus a junction force can be further improved in this point. If the intermediate layer 8 and the thin film 9 are made of different kinds of metal (for example, the former is made of indium or tin and the latter is made of chrome), an interface therebetween may be alloyed. Lamination of thin films made of different materials of chrome, indium, and the like, may also be adopted as the thin film 9. For example, a chrome thin film coming in good intimate contact may be prepared about 0.5 $\mu$m thick on the surface of the dielectric block 2 and an indium thin film may be prepared about 0.1 $\mu$m thick on the chrome thin film to form the thin film 9, increasing a junction force with the intermediate layer 8.

Furthermore, the dielectric portion 21 on the front of the auxiliary electrode plate 22 may be made of a dielectric film deposited by a thermal CVD method. For example, a film of boron nitride, silicon nitride, or silicon carbide may be prepared by the thermal CVD method for forming the dielectric portion 21 for dielectric polarization. The dielectric materials formed by the thermal CVD method, which are excellent in heat resistance and shock resistance, are particularly preferred for processing chucked objects such as semiconductor substrates at high temperatures.

Although the material of the dielectric block 2 is ceramics consisting essentially of aluminum oxide in the foregoing description, other types of ceramics or dielectric materials other than ceramics may be used. To use ceramics, it may be manufactured by a ceramic spraying method or a green sheet laminating method.

As described above, according to the invention, there is provided an electrostatic chucking mechanism drastically improved in durability for use under environments involving severe temperature rise and fall, which was hard to accomplish with the conventional electrostatic chucking mechanism.

What is claimed is:

1. An electrostatic chucking mechanism comprising:
   an electrode body;
   a dielectric block being placed on a front of said electrode body and containing a dielectric portion to be dielectrically polarized by a DC voltage applied via said electrode body for electrostatically chucking an object to be chucked;

an intermediate layer placed between said electrode body and said dielectric block, said intermediate layer being formed of a metal having extendibility for absorbing thermal deformation of said electrode body or said dielectric block, and being heated and pressurized, thereby joining said electrode body and said dielectric block; and a thin film prepared on a surface of said dielectric block, said thin film being placed between said intermediate layer and said dielectric block and being in contact with said intermediate layer.

2. The electrostatic chucking mechanism as claimed in claim 1, wherein said intermediate layer is formed of indium.

3. The electrostatic chucking mechanism as claimed in claim 1, wherein said intermediate layer is formed of tin.

4. The electrostatic chucking mechanism as claimed in claim 1, wherein said intermediate layer is formed of an alloy consisting essentially of indium.

5. The electrostatic chucking mechanism as claimed in claim 1, wherein said intermediate layer is formed of an alloy consisting essentially of tin.

6. The electrostatic chucking mechanism as claimed in claim 1, wherein said thin film is formed of indium.

7. The electrostatic chucking mechanism as claimed in claim 1, wherein said thin film is formed of chrome.

8. The electrostatic chucking mechanism as claimed in claim 1, wherein an auxiliary electrode plate to which the DC voltage is applied is disposed below the dielectric portion of said dielectric block.

9. The electrostatic chucking mechanism as claimed in claim 8, wherein said auxiliary electrode plate is divided into two parts.

10. An electrostatic chucking mechanism as claimed in claim 1, wherein said thin film is purified.

* * * * *